US008659902B2

(12) United States Patent
Colongo et al.

(10) Patent No.: US 8,659,902 B2
(45) Date of Patent: Feb. 25, 2014

(54) ELECTRONIC MODULE AND ELECTRONIC ASSEMBLY COMPRISING SUCH A MODULE

(75) Inventors: Emile Colongo, Montesquieu Volvestre (FR); Olivier Roujean, Toulouse (FR)

(73) Assignee: Airbus Operations S.A.S., Toulouse (FR)

(*) Notice: Subject to any disclaimer, the term of this patent is extended or adjusted under 35 U.S.C. 154(b) by 301 days.

(21) Appl. No.: 13/030,498

(22) Filed: Feb. 18, 2011

(65) Prior Publication Data

US 2011/0205712 A1 Aug. 25, 2011

(30) Foreign Application Priority Data

Feb. 18, 2010 (FR) ...................................... 10 51184

(51) Int. Cl.
*H05K 7/20* (2006.01)
(52) U.S. Cl.
USPC ........... 361/719; 361/707; 361/709; 361/752; 257/727; 174/520; 174/535; 174/548
(58) Field of Classification Search
USPC ....................... 361/676, 679.46, 679.54, 688, 361/704–722, 752, 760
See application file for complete search history.

(56) References Cited

U.S. PATENT DOCUMENTS

| 6,151,215 A * | 11/2000 | Hoffman ....................... 361/704 |
| 6,721,182 B1 * | 4/2004 | Wells et al. ................... 361/704 |
| 7,773,378 B2 * | 8/2010 | Lin ............................... 361/690 |
| 8,222,541 B2 * | 7/2012 | Vander Ploeg et al. ........ 174/382 |
| 8,223,497 B2 * | 7/2012 | Sundstrom et al. ........... 361/707 |
| 2002/0172010 A1 | 11/2002 | Sarno et al. |
| 2006/0044760 A1 * | 3/2006 | Pal ............................... 361/700 |
| 2008/0019102 A1 * | 1/2008 | Yurko ........................... 361/719 |
| 2011/0141692 A1 * | 6/2011 | Bult .............................. 361/700 |

FOREIGN PATENT DOCUMENTS

| EP | 1 947 921 A1 | 7/2008 |
| GB | 2 145 290 A | 3/1985 |
| WO | WO 01/49092 A1 | 7/2001 |

OTHER PUBLICATIONS

French Preliminary Search Report issued Dec. 27, 2010, in Patent Application No. FR 1051184 (FA 741385).

* cited by examiner

*Primary Examiner* — Courtney Smith
(74) *Attorney, Agent, or Firm* — Oblon, Spivak, McClelland, Maier & Neustadt, L.L.P.

(57) ABSTRACT

The invention relates to an electronic module (2) comprising: an electronic card (4) on which electronic components (10) are disposed,
two covers (6, 8), disposed on either side of the card (4).
The cover (6) facing the components (10) has a central part (22) extending at a distance from the card (4) and a flanged edge (24) turned toward the card (4), prolonging one of the two opposite sides of the central part (22). This flanged edge (24) is prolonged by a flat support (26), extending in a plane parallel to the plane of the electronic card (4), the card (4) being added onto the said support (26). The covers (6, 8) bear indexing means (34), the electronic card (4) having indexing holes (36) cooperating with the indexing means (34) during positioning of the card (4) between the covers (6, 8).

11 Claims, 5 Drawing Sheets

ELECTRONIC MODULE AND ELECTRONIC ASSEMBLY COMPRISING SUCH A MODULE

This invention relates to electronic modules, made up of an electronic card protected by two covers.

These electronic modules are engineered to be connected in an on-board electronic assembly, by way of example in aviation. The electronic card bears connection means able to cooperate with the on-board electronic assembly, and the covers protect the electronic components introduced on the card against impacts occurring during handling.

The document EP 1 947 921 discloses such an electronic module. The lower and upper covers are fastened to one another with screws, and the electronic card is held between these covers. The heat generated by the electronic components is discharged into the open air through the covers, and by the possible presence of a heat sink added or integrated onto one of the covers.

The development of technologies in the electronic field, however, tends to increase the power densities dissipated in the electronic components, and the heat to be discharged therefore is more and more intense.

The invention is intended to propose an electronic module able to discharge a greater quantity of heat than in the prior art and the assembling of which is improved. Such a module is used in particular in an electronic assembly with a connection box in which slider zones are provided in order to allow installation of the electronic modules.

For this purpose, the invention has as an object an electronic module, comprising an electronic card, more or less flat, on a first face on which there are disposed electronic components, a first and a second cover, disposed on either side of the electronic card, and on which the first cover, which is opposite the first face of the electronic card, has a central part that extends at a distance from the first face of the electronic card, and at least one flanged edge, turned toward the electronic card and prolonging one of the two opposite sides of the central part, characterized in that the said at least one flanged edge of the first cover is prolonged by a more or less flat support, extending in a plane parallel to the plane of the electronic card, the electronic card being added onto the said support of the first cover.

Such a module advantageously makes it possible to drain the calories toward the support of the cover or covers, and subsequently to direct the heat to be discharged from the thermal components toward the cold zones formed, for example, by slider zones, with which the support of the cover or covers is able to cooperate.

At least one of the covers bears first indexing means and the electronic card has second complementary indexing means able to cooperate with the first indexing means during positioning of the electronic card between the covers.

These indexing means make it possible easily to improve the positioning of the electronic card relative to the at least one cover during assembling of the module. In this way the assembling is facilitated and therefore faster to implement. It will be noted that the two covers may bear indexing means each cooperating with complementary indexing means of the card.

According to a possible characteristic, the first cover has two flanged edges turned toward the electronic card and prolonging the two opposite sides of the central part.

The flanged edges each are prolonged by a more or less flat support extending in a plane parallel to the plane of the electronic card, the latter being added onto the supports of the first cover.

According to various possible characteristics of the invention, taken individually or in combination:
- the first or the second indexing means are holes, while respectively the second or the first indexing means are projecting elements that are able to engage into the holes; in this way one or the other of the card and a cover may bear the first or the second indexing means;
- the second cover has a shape more or less corresponding to the shape of the first cover, with a central part and at least one support which is in contact with the second face of the electronic card;
- at least one thermal contact point is implemented between a cover and one of the electronic components of the electronic card;
- a thermal interface is disposed between one of the electronic components and at least one cover;
- the first cover has on its face opposite the electronic card a heat sink formed with the first cover; and/or
- the contact surface between the electronic card and at least one support of the first cover extends continuously, over more or less the entire length of the card.

Moreover, the invention also has as an object an electronic assembly, comprising at least one electronic module, made up of an electronic card, a first and a second cover, and a connection box in which slider zones are disposed in order to allow installation of at least one electronic module in the said box, characterized in that the first cover has at least one support onto which the electronic card is added, the said at least one support of the first cover being in contact with a wall of the corresponding slider zone, when the electronic module is installed in the connection box, at least one of the covers bearing first indexing means, the electronic card having second complementary indexing means able to cooperate with the first indexing means during positioning of the electronic card between the covers.

According to various characteristics taken individually or in combination:
- the first or the second indexing means are holes, while respectively the second or the first indexing means are projecting elements that are able to engage into the holes;
- the electronic card has a first face on which electronic components are disposed, a first face of the said at least one support of the first cover being in contact, on the one hand, with the wall of the corresponding slider zone and, on the other hand, with the first face of the electronic card;
- an expansion means is disposed in the slider zones, so that activation of the expansion means is able to press at least one support of the first cover against the wall of the corresponding slider zone;
- the electronic card and the two covers extend more or less over the same height, so that the assembly formed by the card and the covers is disposed in the slider zones, the first cover being in contact with the wall of the slider zones, the card and the second cover being pressed against the first cover under the action of the expansion means;
- the first face of the electronic card, in contact with the first face of the said at least one support of the first cover, bears the first connection means.

The invention furthermore has as an object an aircraft comprising at least one electronic module or one electronic assembly such as briefly set forth above.

Other features and advantages of the invention will become apparent through the description provided with reference to the attached Figures in which.

Figure 1:
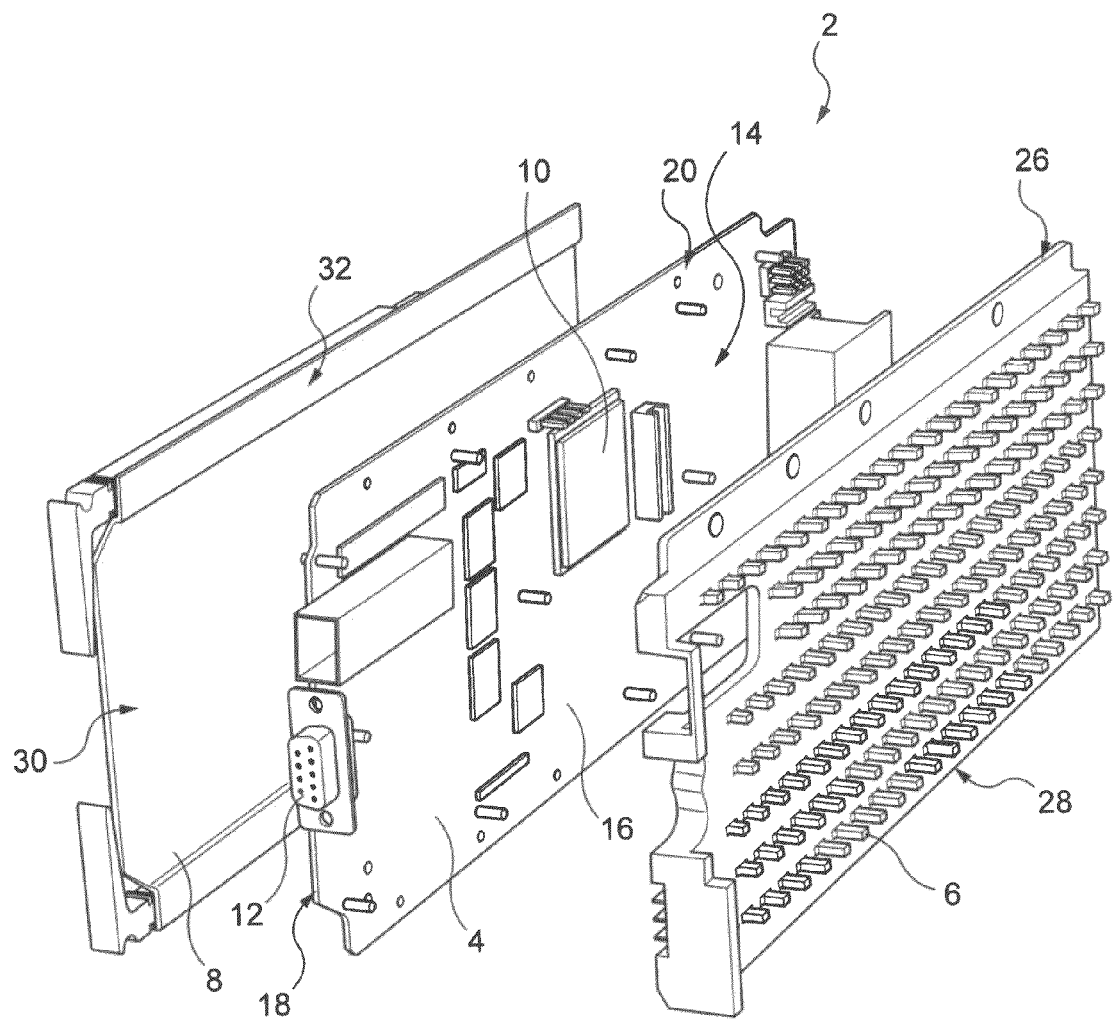
FIG. 1 is an exploded, three-quarter front view of an electronic module according to an embodiment of this invention.

As shown on FIG. 1, an electronic module 2 comprises an electronic card 4 and two covers 6, 8 disposed on either side of card 4, so as to cover the entirety of the said card.

Electronic card 4 is made up of a printed circuit, more or less flat, on which there are soldered electronic components 10 and first connection means 12 able to cooperate with second connection means, not shown, of an on-board electronic assembly. By way of example, such an on-board electronic assembly and an associated electronic module may be disposed in an aircraft, or in any other means of transport the operation of which requires supplied electronics. This electronic assembly also could be used in the data processing field.

Card 4 has a rectangular shape, with a central part 14, and electronic components 10 as well as first connection means 12 are soldered in this central part 14, on first face 16 of the card. More particularly, connection means 12 are added soldered onto a first edge 18 of central part 14.

The two edges of central part 14 directly adjacent to this first edge 18 are each prolonged by a support zone 20, free of electronic components, and which extends along more or less the totality of the length of the card.

Electronic card 4 is disposed between first cover 6 and second cover 8. First cover 6 is the protective element that covers first face 16 of electronic card 4, onto which electronic components 10 are added. First cover 6 has a more or less U shape, with a central part 22 and flanged edges 24, such as shown in particular on FIG. 4.

Central part 22 of first cover 6 extends at a distance from first face 16 of electronic card 4, facing central part 14 of the said card. Two flanged edges 24 prolong two opposite sides of central part 22 of first cover 6, and are turned toward electronic card 4.

Flanged edges 24 of first cover 6 are prolonged by more or less flat supports 26, which extend in a plane parallel to the plane of electronic card 4, moving away from one another starting from flanged edges 24.

First cover 6 has on its face opposite electronic card 4 a thermal sink 28 formed with the first cover.

It will be noted that any other thermal sink may be used and, for example, several fins parallel to each other and arranged perpendicular to the opposite face of the cover.

Second cover 8 has a shape more or les equivalent to the shape of first cover 6, with a central part 30 and supports 32, central part 30 being recessed in relation to the plane in which electronic card 4 extends. Central part 30 is flat and offers a heat exchange surface advantageous for the cooling of components situated facing each other.

Figure 2:
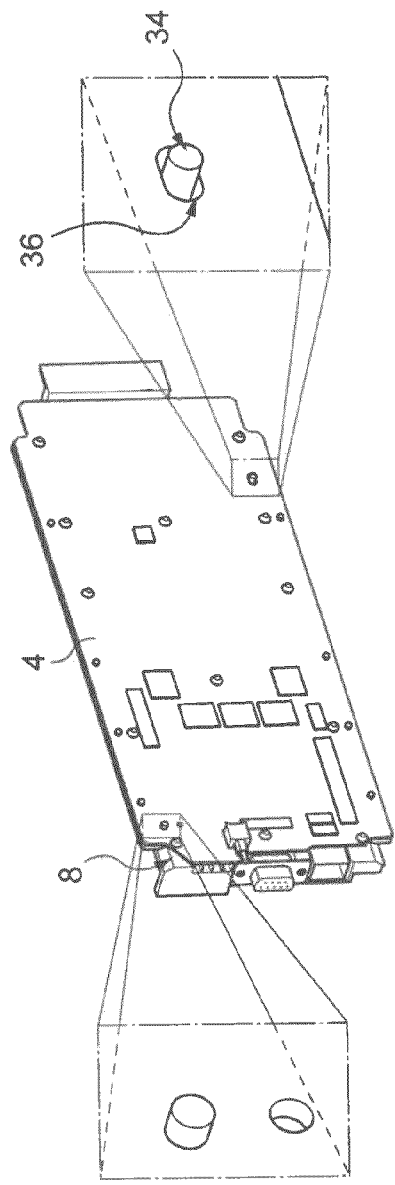
FIG. 2 is a three-quarter front view of the indexing means of the card on a cover according to the invention.
Figure 6:
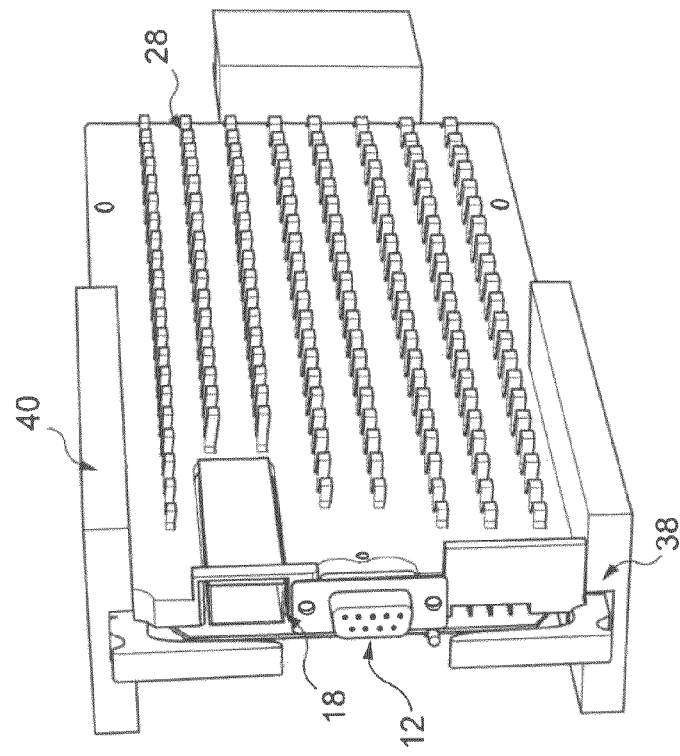
FIG. 6 is a three-quarter front view of an electronic assembly comprising the electronic module shown on FIG. 1.
Figure 3:
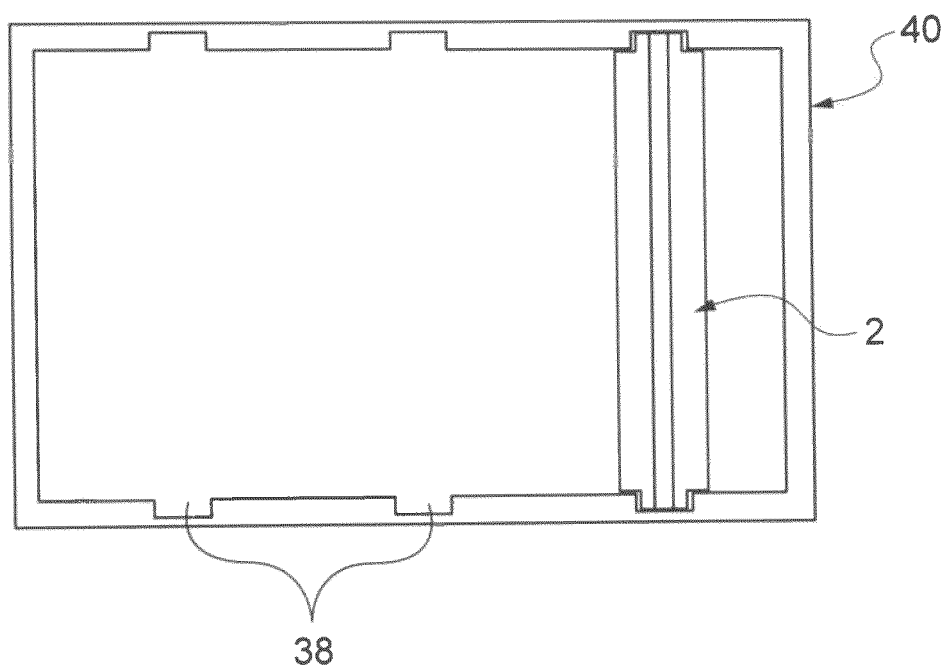
FIG. 3 is a perspective view of the connection box in which an electronic module is able to be inserted.

Indexing means 34 (first means), shown on FIG. 2, are integrated into second cover 8, and have a shape and dimensions that enable them to cooperate with other indexing means of the card (second complementary means), arranged in correspondence, for example indexing holes 36 disposed on electronic card 4, with engagement inside same. It will be noted that the holes in the card do not necessarily open out. Thus, for example, it may be just a matter of hollows or grooves intended to accommodate and position the first indexing means of the cover. These first and second indexing means, which form a plurality of indexing means generally distributed at several places on the cover and the card, make it possible to complete the positioning of electronic card 4 in relation to at least one of the elements of cover 6, 8 during the assembling of module 2. As shown on FIG. 2, the first indexing means are projecting elements extending perpendicular to the face of central part 30 facing card 4. More particularly, the projecting elements are pins or fingers produced for example during manufacture of the cover. It will be noted that means 34 alternatively may be borne by the card, while means 36 are borne by cover 6. Furthermore, cover 8 alternatively may bear indexing means cooperating with complementary indexing means of the card.

According to a variant not shown, it will be noted that the two covers and the card each may bear indexing means so as to facilitate positioning of the card in relation to each cover. For example, cover 6 comprises first indexing means identical to means 34 and which are adapted for cooperating with complementary indexing means of the card, identical to means 36 but located at another place.

According to another variant not shown, the first and second indexing means may take on other shapes and, for example, be of the tenon and mortise type.

As mentioned above, the assembling of card 4 and covers 6, 8 forms electronic module 2.

Electronic card 4 is disposed between covers 6 and 8, so that the central parts of the covers and of the card are superposed. In this arrangement, support zones 20 of electronic card 4 are gripped between supports 26, 32 of respective covers 6, 8, which extend over more or less the entire length of the said electronic card.

Electronic components 10 are disposed in the space created by the U shape of first cover 6, and in this way are protected against possible impacts during handling. First connection means 12, added onto first edge 18 of first face 16 of the card, also may be at least partially covered and protected by first cover 6.

The contact zone created between the electronic card and the covers, at the supports, allows an optimal heat drainage toward support 26 of first cover 6, for the purpose of dissipating the calories drained toward a cold zone, described subsequently, and into the ambient air by heat sink 28.

These contact zones, implemented on two opposite sides of the central parts, moreover impart a stiffness to the assembly and an improved flatness of the electronic card.

Thermal contacts advantageously may be devised between electronic components 10 and one of the elements of cover 6, 8, so as to drain into the covers a large part of the power dissipated by the card, and particularly for components giving off the most calories. In an embodiment not shown, this thermal contact may be optimized by inserting a thermal interface reducing the thermal resistance of the contact.

With reference to FIGS. 3 to 6, there now is described an electronic assembly according to the invention, in which an electronic module 2, made up of a card 4 and two cover elements 6, 8 is able to cooperate with slider zones 38 disposed in a connection box 40. For reasons of convenience, only the cooperation between the upper supports of the module and the upper slider zone of the connection box is going to be described.

It will be understood that advantageously two slider zones are provided so that the movement of module 2 is facilitated. By way of example, shown in particular on FIG. 3, these slider zones 38 are formed on a connection box 40. The box has two high and low slider zones, making it possible to insert the electronic modules. Sliders 38 are formed in two opposite faces of connection box 40, so as to constitute two pairs of sliders facing one another intended to accommodate electronic modules 2.

Figure 4:
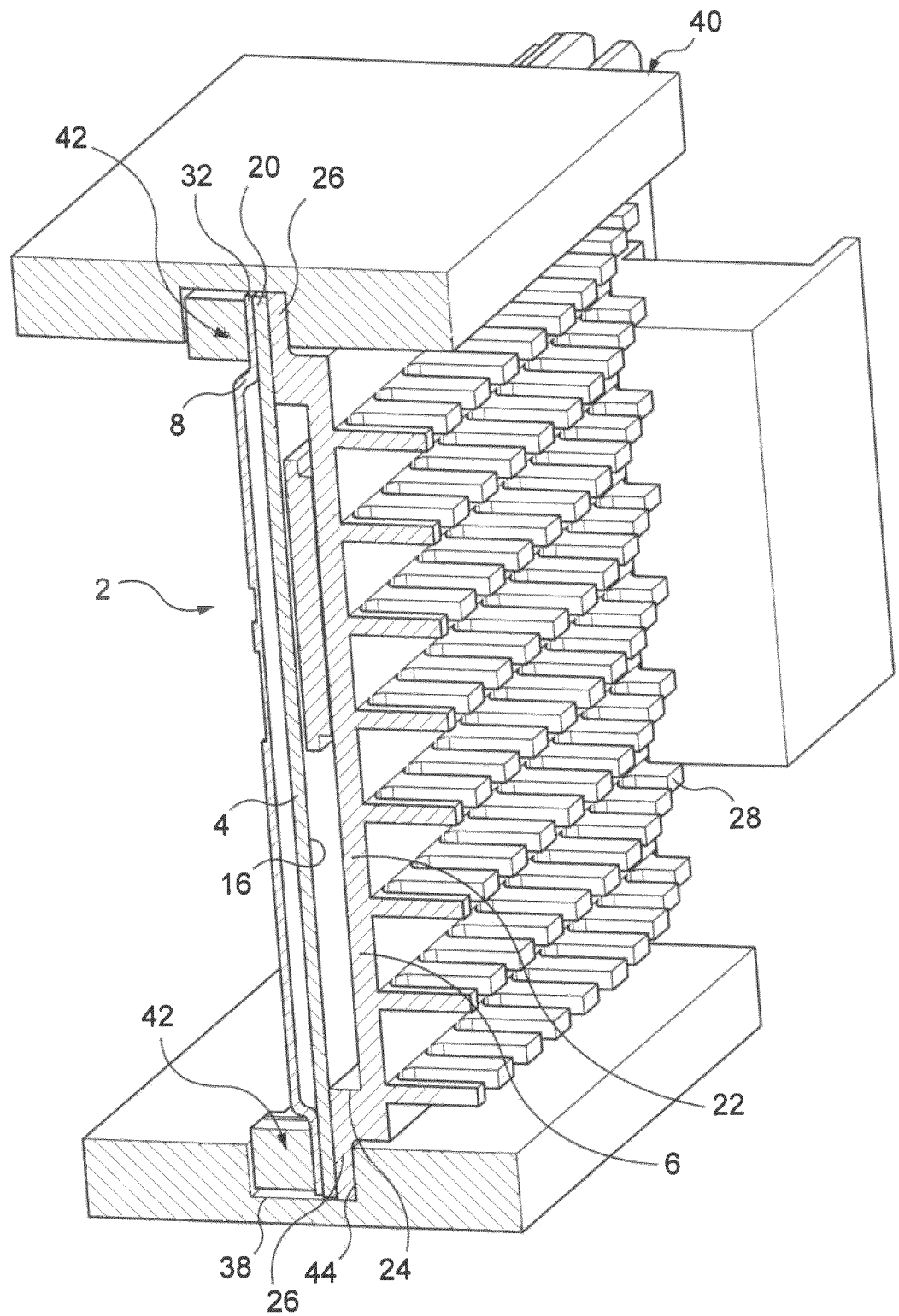
FIG. 4 is a three-quarter front view in cross section, of an electronic assembly according to a first embodiment.

According to a first embodiment, shown on FIG. 4, support zone 20 of electronic card 4 is gripped between support 26 of first cover 6 and support 32 of second cover 8. Electronic card 4 and the two covers extend more or less over the same height, so that the assembly formed by card 4 and covers 6, 8 is disposed in slider zones 38 and slides in these sliders until effective placement. An expansion mechanism 42 makes it possible to compensate for the functional sliding clearance between slider zone 38 and electronic module 2, and makes it possible to grip support zone 20 of electronic card 4 between support 26 of first cover 6, and support 32 of second cover 8. By way of example, expansion mechanism 42 is a cam the placement of which in rotation makes it possible to press the entire module 2 against a wall of slider zone 38.

The contact between module 2 and slider 38 is achieved through a face of support 26 of first cover 6 and a wall 44 of slider zone 38.

Figure 5:
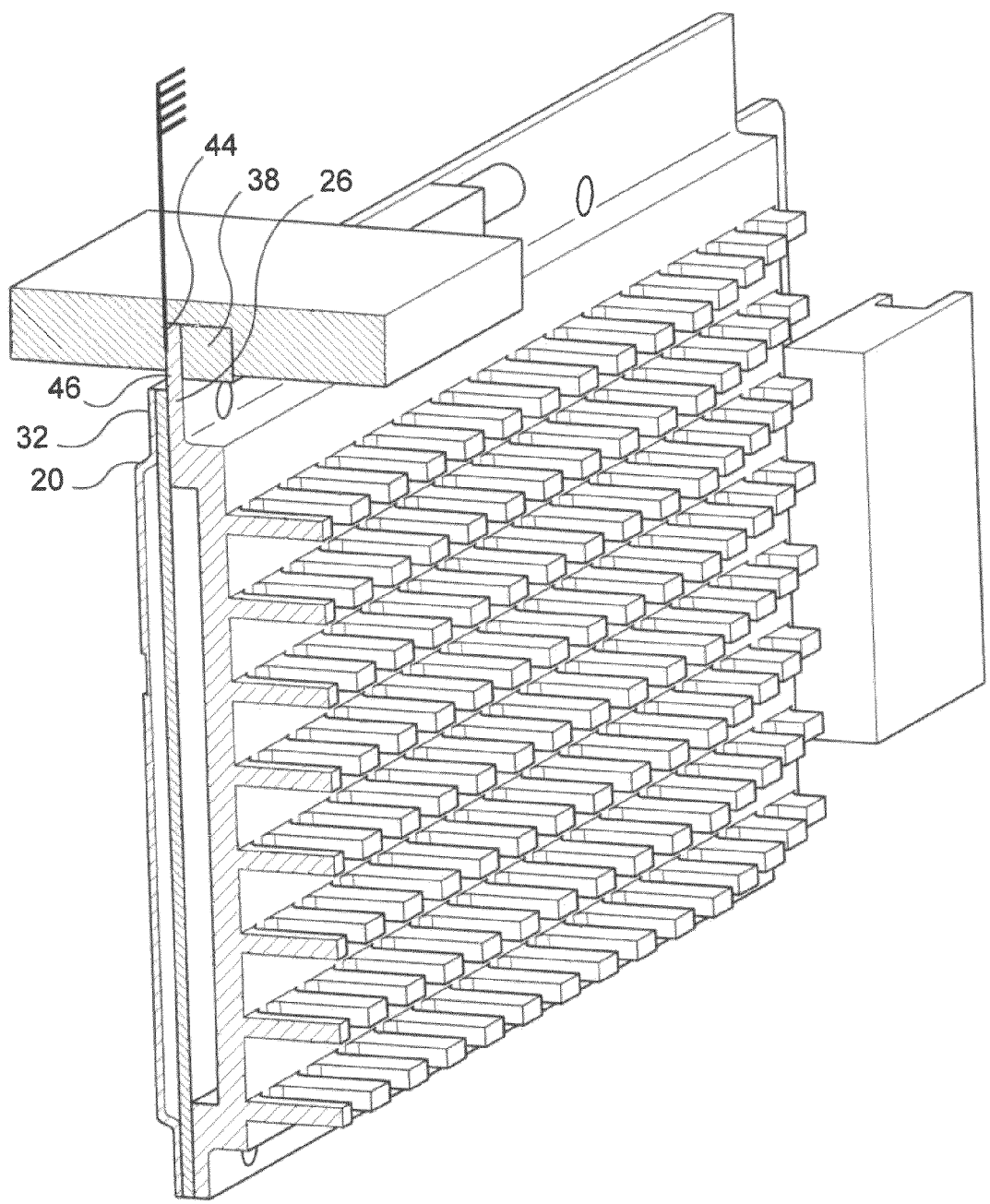
FIG. 5 is a view, in a cross section similar to that of FIG. 4, of an electronic assembly according to a second embodiment.

According to a second embodiment, shown on FIG. 5, only support 26 of first cover 6 is situated in slider zone 38. The upper part of this support 26 of the first cover is in contact with a wall 44 of slider zone 38, clamped against the latter through an expansion means 42. Support zone 20 of electronic card 4 and support 32 of second cover 8, which are less extensive than support 26 of the first cover, are added by screwing onto a lower part of support 26 of first cover 6, support zone 20 of electronic card 4 being disposed between the lower part of support 26 of first cover 6 and support 32 of second cover 8.

In the two embodiments shown on FIGS. 4 and 5, the electronic assembly has the advantage of being able to drain the calories received by first cover 6 toward a cold zone formed by slider zone 38 in connection box 40. In this way, the contact of support 26 of first cover 6 with wall 44 of this slider 38 provides a further heat dissipation path, in addition to heat sink 28 disposed on the back of first cover 6.

Moreover, in the case of FIG. 5, where only support 26 of first cover 6 is situated in slider zone 38, a first face 46 of support 26 is in contact with wall 44 of corresponding slider 38, and it is this first face 46 of support 26 that also is in contact with first face 16 of electronic card 4 bearing the connection means.

The result is a more precise positioning of connection means 12 of module 2 in relation to connection box 40, and therefore a more precise positioning in relation to the second connection means not shown, borne, by way of example, by the back of connection box 40.

The invention claimed is:

1. An electronic module, comprising:
   an electronic card, substantially flat, on a first face of which electronic components are disposed,
   a first cover and a second cover, disposed on either side of the electronic card, and in which the first cover, which is opposite the first face of the electronic card, has a central part, which extends at a distance from the first face of the electronic card, and at least one flanged edge turned toward the electronic card and prolonging one of the two opposite sides of central part, the at least one flanged edge of the first cover including a substantially flat support, extending in a plane parallel to the plane of the electronic card, the electronic card being added onto the said support of the first cover, at least one of the covers including a first indexing element, the electronic card including a second complementary indexing element that engages with the first indexing element during positioning of the electronic card between the covers.

2. The electronic module according to claim 1, wherein the first or the second indexing element is a hole, while respectively the second or the first indexing element is a projecting element that engages with the hole.

3. The electronic module according to claims 1 or 2, wherein the second cover has a shape more or less corresponding to the shape of the first cover, with a central part and at least one support that is in contact with the second face of the electronic card.

4. The electronic module according to claim 1, wherein at least one thermal contact point is implemented between one of the first cover and the second cover and one of the electronic components of the electronic card.

5. The electronic module according to claim 4, wherein a thermal interface is disposed between one of the electronic components and at least one of the first cover and the second cover.

6. An electronic assembly, comprising:
   at least one electronic module, made up of
   an electronic card,
   a first cover and a second cover, and
   a connection box in which slider zones are disposed in order to allow installation of at least one electronic module in the said box, the first cover including at least one support onto which the electronic card is added, the said at least one support of the first cover being in contact with a wall of the corresponding slider zone, when the electronic module is installed in the connection box, at least one of the covers including a first indexing element, the electronic card including a second complementary indexing element that engages with the first indexing element during positioning of the electronic card between the covers.

7. The electronic assembly according to claim 6, wherein the first or the second indexing element is a hole, while respectively the second or the first indexing element is a projecting element that engages with the hole.

8. The electronic assembly according to claims 6 or 7, wherein the electronic card has a first face on which the electronic components are disposed, a first face of the said at least one support of the first cover being in contact, on the one hand, with the wall of the corresponding slider zone and, on the other hand, with the first face of the electronic card.

9. The electronic assembly according to claim 6, wherein an expansion element is disposed in the slider zones, so that the activation of expansion element presses at least one support of the first cover against the wall of the corresponding slider zone.

10. The electronic assembly according to claim 9, wherein the electronic card and the two covers extend substantially over the same height, so that the assembly formed by the card and the covers is disposed in the slider zones, the first cover being in contact with the wall of the slider zones, and the second cover being pressed against the first cover under the action of the expansion element.

11. An aircraft comprising:
   at least one electronic module according to claim 1 or at least one electronic assembly according to claim 6.

* * * * *